US005706007A

United States Patent [19]

Fragnito et al.

[11] Patent Number: 5,706,007

[45] Date of Patent: Jan. 6, 1998

[54] ANALOG CURRENT / DIGITAL BUS PROTOCOL CONVERTER CIRCUIT

[75] Inventors: Carlos Roberto Fragnito; José Guilherme Guasti, Jr.; Libânio Carlos De Souza, all of Sertãozinho; Luiz Antonio Ginatto; Marco Antonio Graton, both of Ribeirão Preto, all of Brazil

[73] Assignee: SMAR Research Corporation, Ronkonkoma, N.Y.

[21] Appl. No.: 542,594

[22] Filed: Jan. 3, 1995

[51] Int. Cl.[6] ........ H03M 1/00

[52] U.S. Cl. ........ 341/155

[58] Field of Search ........ 341/155, 156, 341/161, 110, 126, 142

[56] References Cited

U.S. PATENT DOCUMENTS

| | | | |
|---|---|---|---|
| 5,558,115 | 9/1996 | Lenz et al. | 137/86 |
| 5,563,587 | 10/1996 | Harjani | 340/870.3 |

OTHER PUBLICATIONS

Michael Babb, *Control Engineering,* "A Fieldbus First: New Transmitter Works With Two Protocols" (May 1994).

Fieldbus Foundation™, Fieldbus Specification, Function Block Application Process —Part 1, FF–94–890, Revision PS 1.0, Apr. 27, 1995.

Fieldbus Foundation™, Fieldbus Specification, Function Block Application Process —Part 2, FF–94–891, Revision PS 1.0, Apr. 27, 1995.

*Primary Examiner*—Brian K. Young

*Attorney, Agent, or Firm*—Kenyon & Kenyon

[57] ABSTRACT

Protocol converter device converts between a 4–20 mA analog signal format and a digital Fieldbus signal format. An input circuit is provided, coupled to the transmitters which includes a multiplexer for selecting one of the analog signals from the transmitters of, e.g., three different field devices or from the analog signal converted from a digital signal. After the analog signal is converted to a digital signal, a central processing unit converts the converted digital signal into a digital quantity of a property of interest which may be display and/or transmitted to other devices or a control computer via a Fieldbus. The central processing unit selects which transmitter converted analog signal is to be displayed. The converter circuit can be placed in an environmental hazard resistant housing, to create a protocol conversion unit that can be located in a convenient field or control center location.

22 Claims, 12 Drawing Sheets

ANALOG CURRENT / DIGITAL BUS PROTOCOL CONVERTER CIRCUIT

FIELD OF THE INVENTION

The present invention relates to process control systems, and more particularly, to a circuit for converting between analog signals used in a process control environment and Fieldbus compliant digital signals.

BACKGROUND OF THE INVENTION

Process control relates to the control of processes, e.g., manufacturing processes, through the use of control devices including sensors, e.g., temperature sensors, pressure sensors, flow sensors, digital control systems, e.g., computers, and valves. FIG. 1A illustrates a representative known control system incorporating a digital control system comprising a central control computer 200 coupled to a plurality of field devices, e.g. sensors 210 and control valves 212 via individual two wire communication lines 202. In the system illustrated in FIG. 1A, each of the sensors 210 or valves 212 is coupled to the computer via a separate connection using the analog 4–20 mA communications standard.

While the analog 4–20 mA standard has been in use for many years, the process control industry has come to realize that the use of a digital communication protocol for networking control devices together offers several advantages in terms of networking simplicity and reliability not available from the 4–20 mA standard. For example, using a digital communication protocol such as the Fieldbus communications protocol, permits multiple devices capable of digital communication, such as the sensors 240 and valve 242 illustrated in FIG. 1B, to be coupled to each other and a control computer 220 via a single two wire bidirectional bus 230. In such a system the need to couple each device 240, 242 directly to the control computer 220 is eliminated.

The Fieldbus communications protocol is described in FIELDBUS FOUNDATION™, Fieldbus Specification, Function Block Application Process, Parts 1 and 2, Revision PS 1.0, Apr. 27, 1995 which are hereby expressly incorporated by reference. It should be noted that while the cited Fieldbus Specification documents are useful in providing an understanding of the Fieldbus protocol, they are not prior art to the present application.

Since the use of a digital communication protocol and bus in a control system environment offers substantial advantages over the existing analog communications protocol the use of such digital systems is fast becoming the standard for process control systems being purchased today.

However, the cost of converting or upgrading an existing analog system to a digital system can be extremely expensive because of the incompatibility between already installed analog field devices, e.g., valves and sensors, and the digital communication protocol.

Accordingly, there is a need for methods and apparatus which permit existing field devices, e.g., analog sensors and valves, to be integrated into a digital process control system or network, e.g., a Fieldbus network.

Furthermore, it is highly desirable that such methods and apparatus be easy to implement and require a minimal amount of rewiring of the existing control system. It is further desirable that no modification to existing analog field devices be required.

SUMMARY OF THE INVENTION

The present invention is directed to methods and apparatus for converting analog signals used in a process control environment into Fieldbus compliant digital signals. The apparatus of the present invention can be used when upgrading existing analog systems, e.g., 4–20 mA systems to digital, e.g., Fieldbus networks, or to simply integrate an existing analog device with a control system which uses a Fieldbus network to couple devices together.

Because, as will be discussed further below, the apparatus of the present invention can be coupled to multiple analog devices, e.g., existing analog sensors and valves, and convert between the analog signals used by the existing analog devices and the digital signals used on a Fieldbus, the use of the converter circuit of the present invention offers substantial cost benefits when compared to the alternative of replacing existing analog field devices with digital field devices.

For example, use of the converter circuit of the present invention eliminates the labor cost associated with replacing existing analog field device as well as the cost of purchasing a digital field device to replace the existing analog device.

Because the converter circuit of the present invention can be coupled to an analog device via a conventional 4–20 mA wiring system, it is possible to locate the converter circuit of the present invention where the 4–20 mA system lines were previously coupled to a control computer. In such an embodiment, the converter circuit of the present invention acts as an interface between the digital Fieldbus network, control computer, and devices attached thereto, and the already existing analog field devices. Thus, use of the converter circuit of the present invention allows an analog control system to be upgraded to a Fieldbus system without the need to substantially re-wire the existing system.

In one exemplary embodiment, the converter circuit of the present invention comprises a first circuit for coupling to one or more analog filed devices and a second circuit for coupling to a Fieldbus. The converter circuit of the present invention can be used to convert digital signals received from the Fieldbus via the second circuit into analog signals which are then supplied via the first circuit to an analog device. Alternatively, the converter circuit can be used to convert analog signals received via the first circuit into digital Fieldbus signals which are then output via the second circuit. As an alternative, separate converters may be implemented with a first converter serving to convert analog signals to digital Fieldbus signals and a separate second converter being used to convert digital Fieldbus signals into analog, e.g., 4–20 mA signals.

In an exemplary embodiment, a converter for converting analog 4–20 mA signals into digital, e.g., Fieldbus, signals comprises an input circuit which includes a multiplexer having at least two inputs and one output. Each of the inputs of the multiplexer are coupled to a different field device. The multiplexer selects one of the field devices, i.e., the analog signals received therefrom, to be the multiplexer's output signal. An analog-to-digital (A/D) converter is coupled to the output of the multiplexer which converts the selected analog output signal into a digital signal.

In the exemplary embodiment, main processing circuit coupled to the input circuit includes a central processing unit which receives the digital signal, converts the digital signal and converts the digital quantity of a property of interest from the selected field device. Examples of the property of interest include pressure, temperature, and flow rate. The central processing unit controls selection of the analog output signal from the multiplexer.

A display circuit coupled to the main processing circuit includes a display and a display controller. The display controller receives the digital quantity of a property of interest from the central processing unit and displays this value at the display.

The input analog signals can be of the standard 0–20 mA or 4–20 mA format. The converter circuit can also be a part of a communication network where the converter circuit communicates the digital quantity of the property of interest over a communication bus (e.g., one operating according to the Fieldbus protocol). For this purpose, a modem circuit is coupled between the central processing unit and the communication bus to handle the handshaking signal processing. A local adjust, coupled to the central processing unit, allows a user to enter or select stored input conversion parameters and display criteria to the conversion circuit.

The circuit of the present invention for converting digital signals to analog signals is similar to the embodiment described above for converting analog signals to digital signals but incorporates a digital to analog ("D/A") converter located between the multiplexer and main processing circuit for converting the digital signals into analog, e.g., 4–20 mA, signals.

DETAILED DESCRIPTION

Figure 2A:
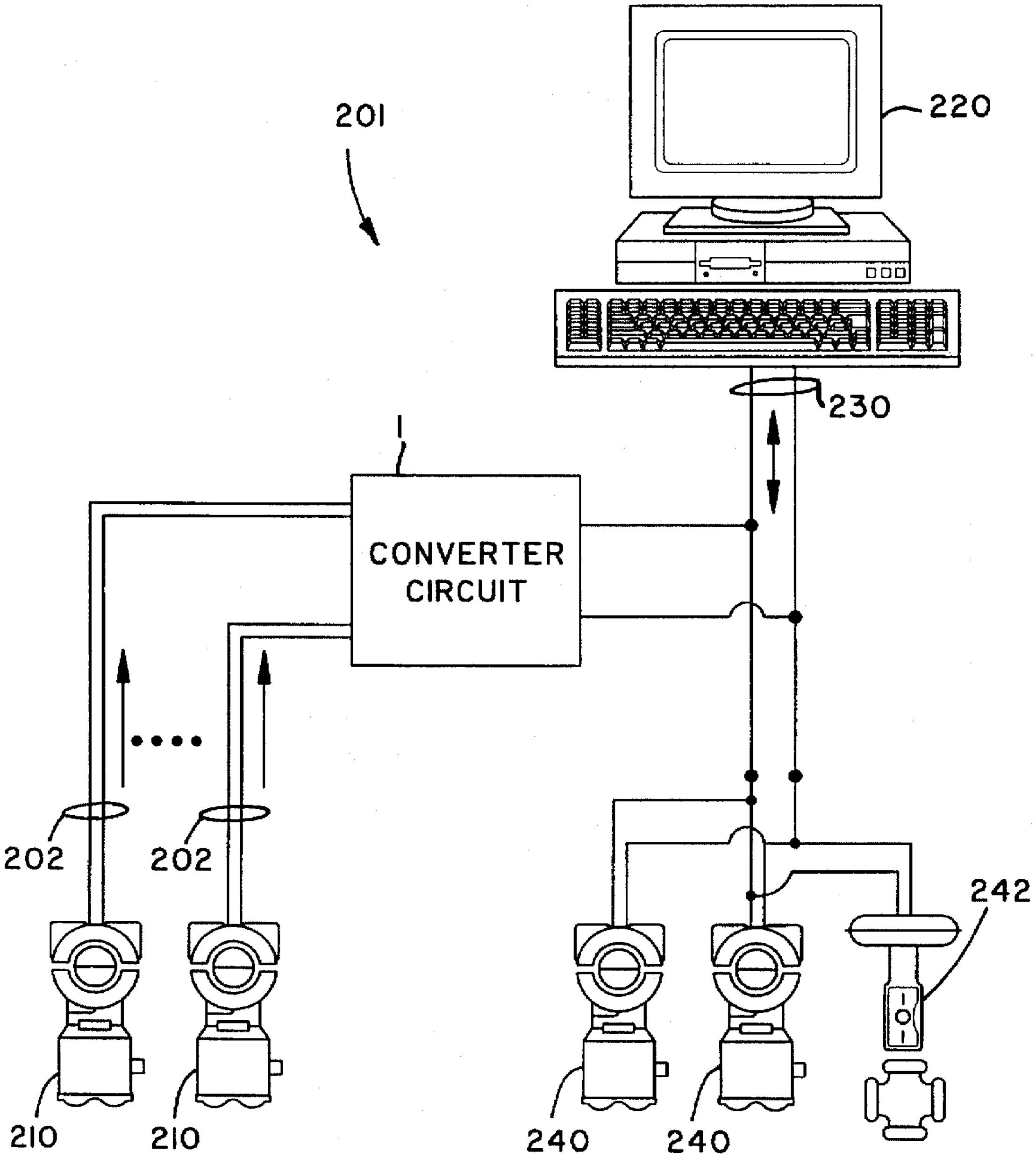
FIG. 2A is a diagram of a control system comprising both analog field devices and digital Fieldbus compatible devices with a protocol converter circuit of the present invention being used to couple the analog field devices to the control computer and digital Fieldbus compatible devices.

Referring to FIG. 2A, there is illustrated a control system 201 comprising a control computer 220. The control computer 220 is coupled via a digital two wire bus 230 to Fieldbus compatible sensors 240 and a Fieldbus compatible valve 242. The control computer 220 is also coupled via the digital bus 230 and the signal converter circuit 1 of the present invention, to sensors 210 which are connected to the converter circuit 1 via lines used to transmit, e.g., 4–20 mA, analog signals. As illustrated, the converter circuit 1 permits 4–20 mA analog communication compatible devices to be used in a control system which uses a digital Fieldbus compliant communication protocol.

Each of the analog sensors 210 comprise a sensor unit stored in, e.g., the bottom section of the sensor housing, and an analog transmitter stored in, e.g., the upper section of the sensor housing. Similarly the digital sensors 240 and control valve 242 included a sensor or control unit and a digital transmitter/receiver circuit for transmitting and receiving digital information, e.g., according to the Fieldbus protocol.

Figure 2B:
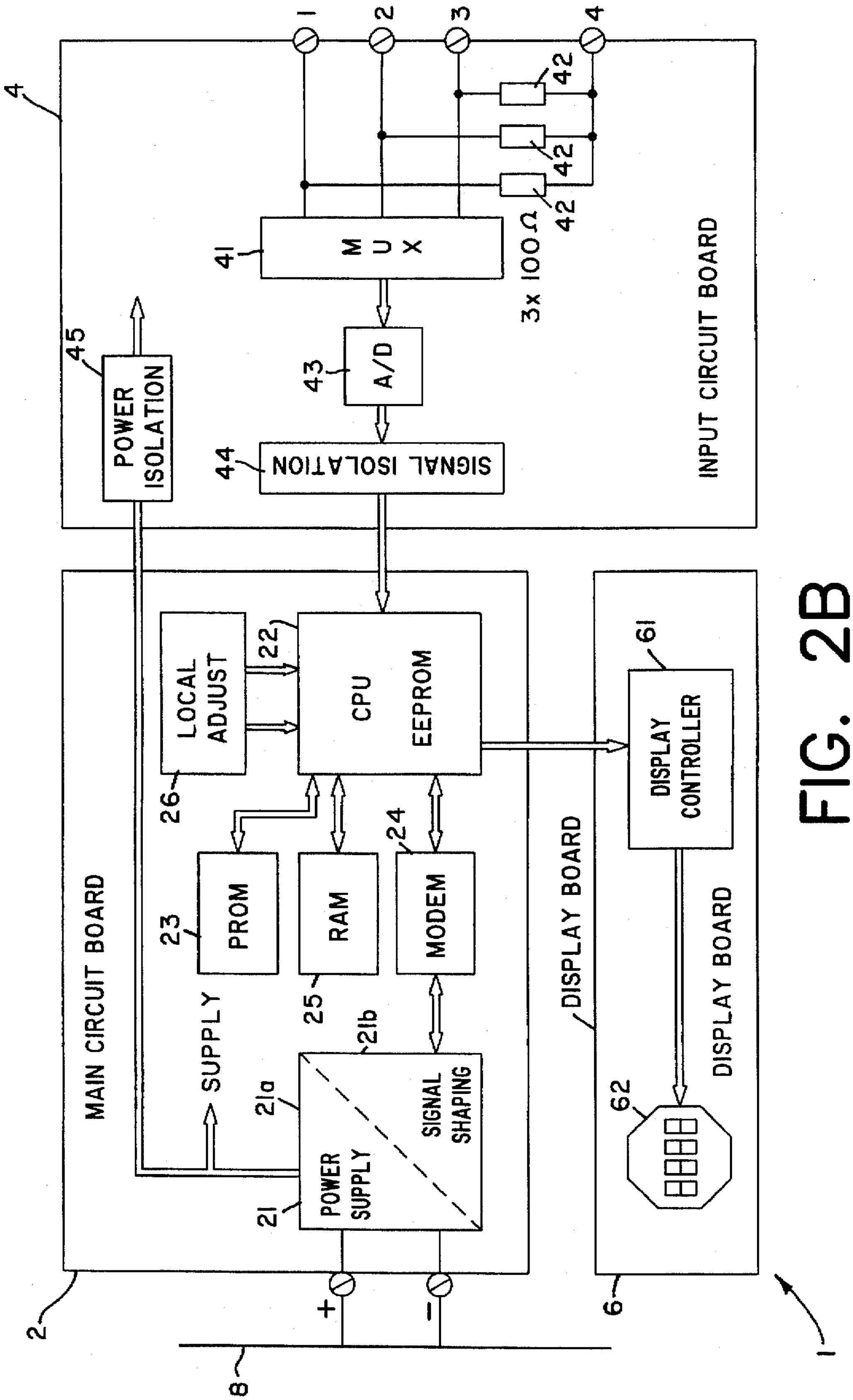
FIG. 2B is a block diagram of an analog to Fieldbus signal converter circuit implemented in accordance with one embodiment of the present invention.

The converter circuit 1 of the present invention illustrated in FIG. 2A is shown in greater detail in FIG. 2B. The converter circuit 1 comprises three major components: a main circuit board 2, an input circuit board 4, and a display board 6. The main circuit board 2 is coupled at one end to a data communication bus 8 via power supply/signal shaping component 21. In this embodiment, the data bus 8 is operated according to the Fieldbus protocol, which has gained acceptance in the process control field. The main circuit board 2 receives power from the bus 8 via one or more signal conductors on the bus 8. Power from the bus 8 is received at the power supply section 21*a* of component 21. One skilled in the art will appreciate that power can be supplied from other sources such as a controller or a voltage supply. Power received in power supply 21*a* is then supplied to other components in the converter circuit 1, such as the input circuit board 4 and the components on the main circuit board 2.

Figure 2C:
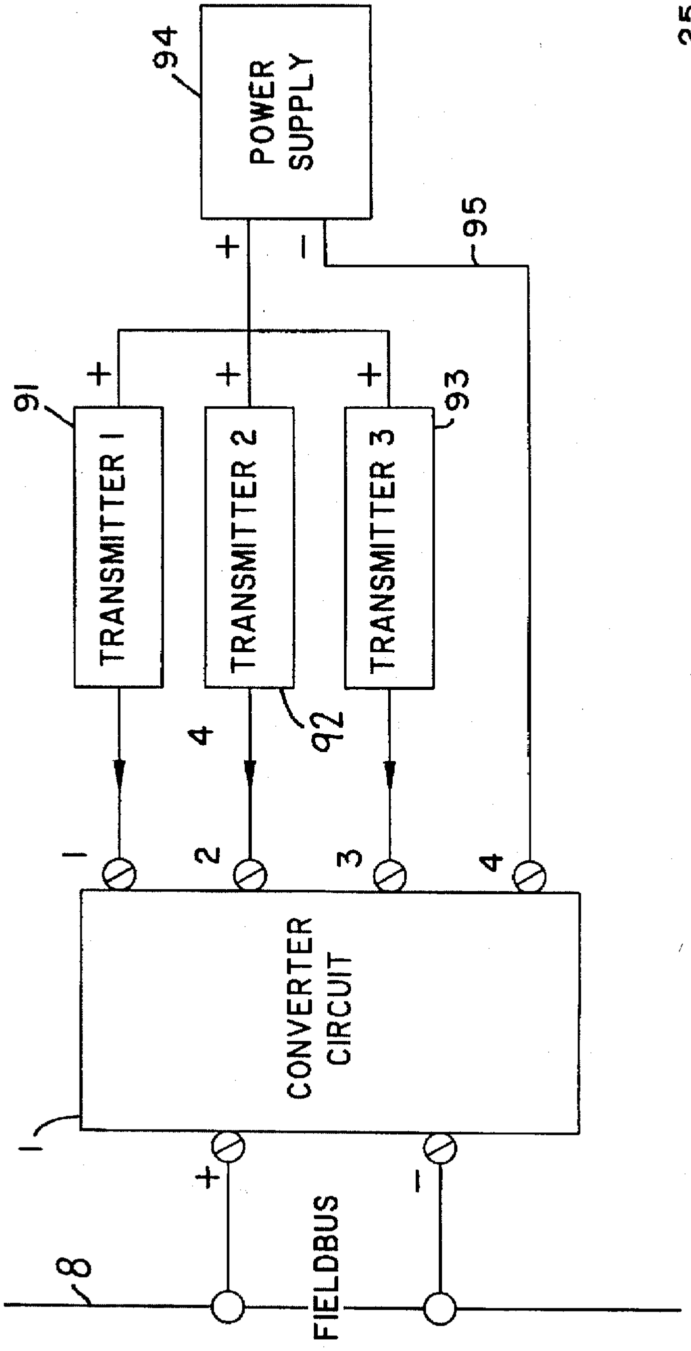
FIG. 2C is a general block diagram of the interconnection between the transmitters of a plurality of analog devices and the exemplary converter circuit of FIG. 2B.

The other end of the converter circuit 1 is coupled to a plurality of analog devices, e.g., sensors and control valves via the transmitter/receiver circuits included in such devices. Referring to FIG. 2C, transmitter circuits 91, 92, and 93 of three different analog devices are illustrated coupled to the converter circuit 1. The analog signal being transmitted by the transmitter circuits 91, 92, and 93 can be a 0–20 mA or 4–20 mA or any of a variety of analog formats. In this embodiment, the transmitters 91, 92, and 93 have a common power supply 94. The power supply 94 provides a common ground or reference voltage on line 95 relative to the signals being supplied by the transmitters 91, 92, and 93.

Referring back to FIG. 2B, the analog signals from the transmitter circuits 91, 92, and 93 are input to a multiplexer (MUX) 41 of the converter circuit 1. The reference voltage is supplied via resistors 42 to the input lines of the MUX 41 and the output lines from the transmitters. MUX 41 selects one of the input lines from the transmitters 91, 92, or 93 and supplies the analog signal to analog-to-digital (A/D) converter 43. The A/D converter 43 converts the analog signal into a digital signal so that it can be used on the main circuit board 2. Signal isolation 44 isolates the digital signal from the A/D converter 43 and supplies it to the Central Processing Unit (CPU) 22 of the main circuit board 2. Power isolation 45 isolates the power from the power supply 21*a* and supplies it to the components of the input circuit board 4.

As shown in FIG. 2*a*, the CPU 22 is the intelligent portion of the converter circuit 1 and is responsible for the management of data values, self diagnostics, and communication. In a manner known to those skilled in the art, the program upon which the CPU 22 operates can be stored in a memory device such as a Programmable Read Only Memory (PROM) 23. In this embodiment, the CPU 22 includes an electrically erasable programmable read only memory (EEPROM) to store necessary data for the CPU 22. Examples of necessary data are calibration data, configuration data, and identification data. A communications control is provided as a modulator-demodulator (modem) 24. The modem 24 monitors activity on the bus 8 and the output of the CPU 22. A random access memory (RAM) is provided for the storage of data by the CPU 22. A local adjust device 26 is coupled to the CPU 22. The local adjust device 26 serves as an input device by providing input to the CPU 22 which determines the type of processing, e.g., data conversions, performed by the CPU 22. In this embodiment, the local adjust device is activated by a magnetic tool without the need for mechanical or electrical contact. The operation of the local adjust device will be described in further detail below.

Figure 6:
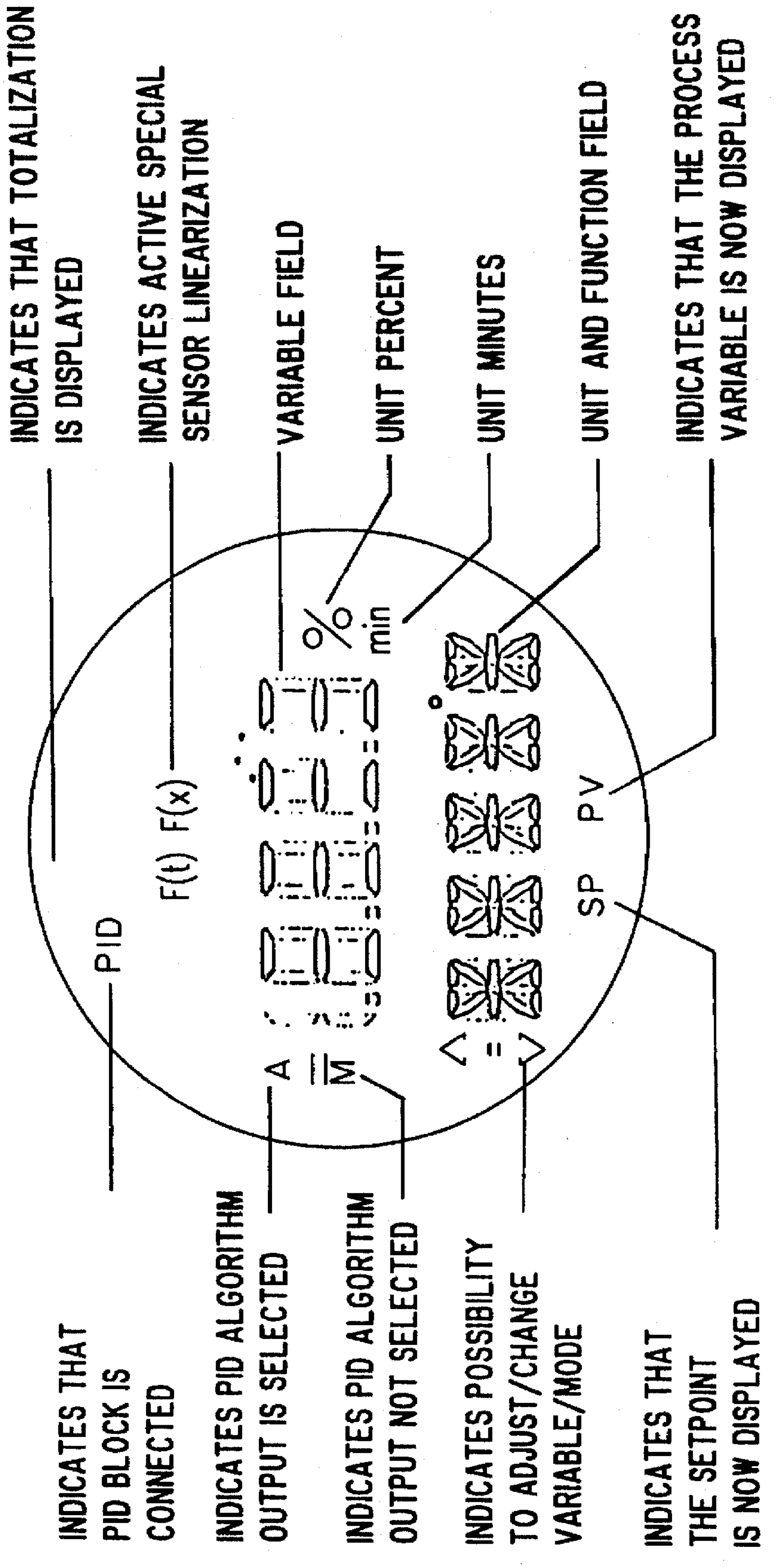
FIG. 6 shows a display to be used with the converter circuit of FIG. 2A.

The CPU 22 is coupled to the display board 6 via a display controller 61. The CPU supplies a digital quantity of a property of interest. The display controller converts digital data provided by the CPU 22 into the appropriate signals for displaying this digital data on display 62. In this embodiment, the display is a liquid crystal display (LCD) having four characters as shown in FIG. 6. One skilled in the art will appreciate that other types of displays are possible (e.g., a CRT display, an light-emitting diode (LED) display, a LED bar graph, etc.).

Figure 1A:
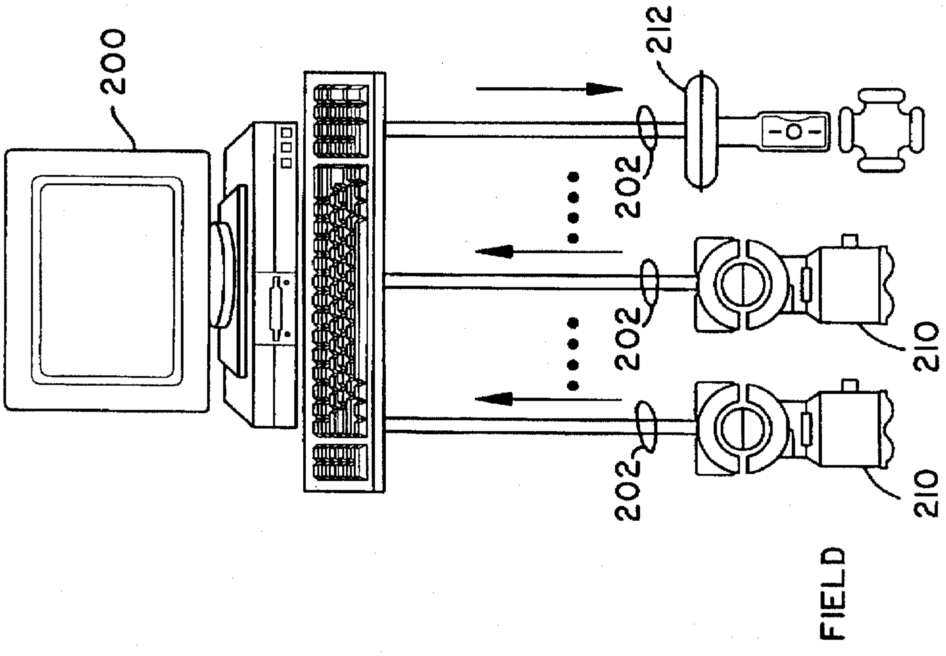
FIG. 1A PRIOR ART
FIG. 1A os a block diagram of a prior art control system implemented using the 4–20 mA analog standard.
Figure 1B:
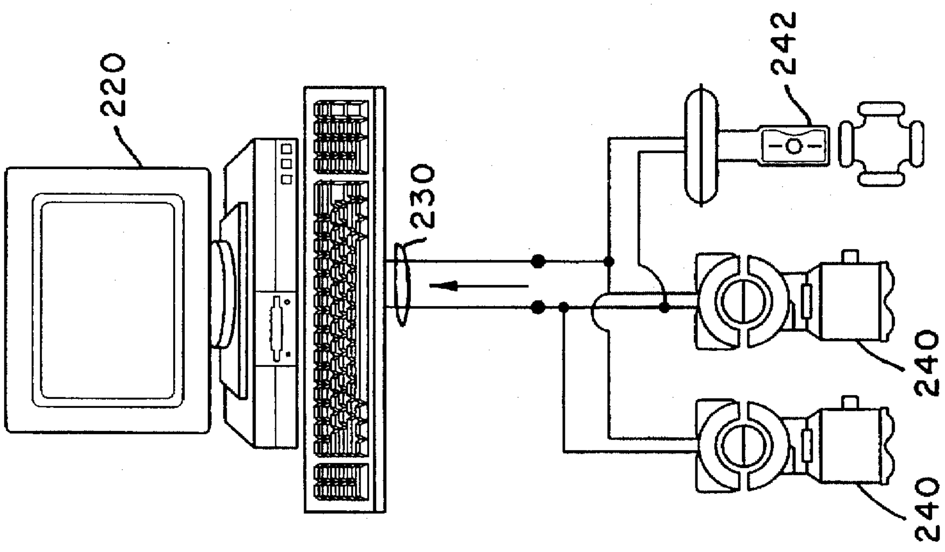
FIG. 1B PRIOR ART
FIG. 1B is a block diagram of a prior art control system using the digital Fieldbus protocol.
Figure 3:
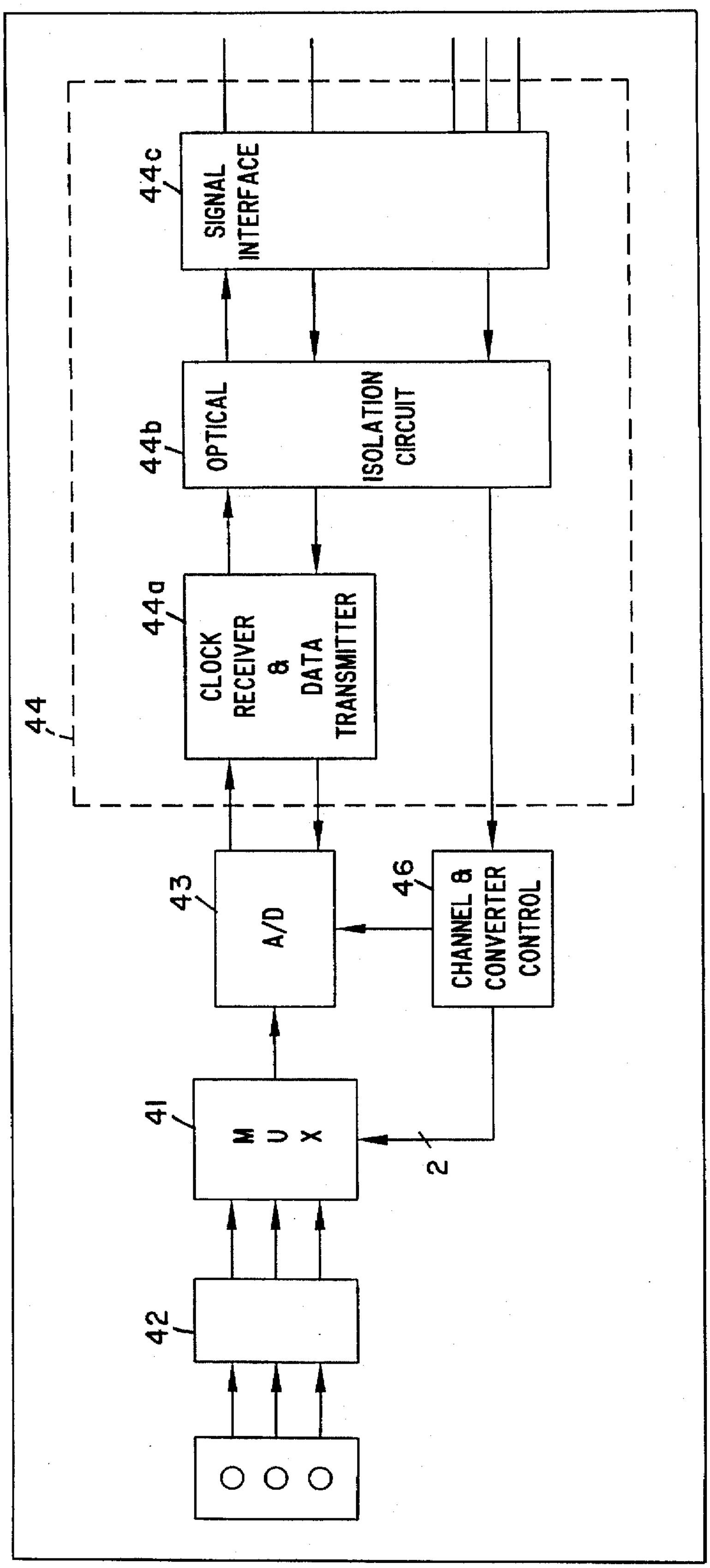
FIG. 3 is a block diagram of the signal isolation component of the exemplary converter circuit of FIG. 2B.

Referring to FIG. 3, a more detailed block diagram of the signal isolation block 44 of the input circuit board 4 of FIG. 1 is shown. The signal isolation block 44 includes a clock receiver and data transmitter circuit **44*a* which transmits a clocking signal to the A/D converter 43 and receives the digital data from the A/D converter 43. Circuit 44*a* transmits the digital data to optical isolation circuit 44*b* and receives from the optical isolation circuit 44*b* the clocking signal for the A/D converter 43. A signal interface 44*c* provides an interface between the optical isolation circuit 44*b* and the CPU 22 of the main circuit board 2. The optical isolation circuit 44*b* electrically isolates the signals passing between the signal interface and the clock receiver and data transmitter circuit 44*a*** in a known manner.

The optical isolation **44*b* also electrically isolates the signals passing between the signal interface 44*c* and a channel and converter control circuit 46. These signals include a control signal for the A/D converter 43 and a select signal for the multiplexer 41. In this embodiment, the select signal for the multiplexer 41 is a 2-bit value from the CPU 22 (see FIG. 1) so as to allow selection of one of the three analog input signals to the multiplexer 41**.

Figure 4:
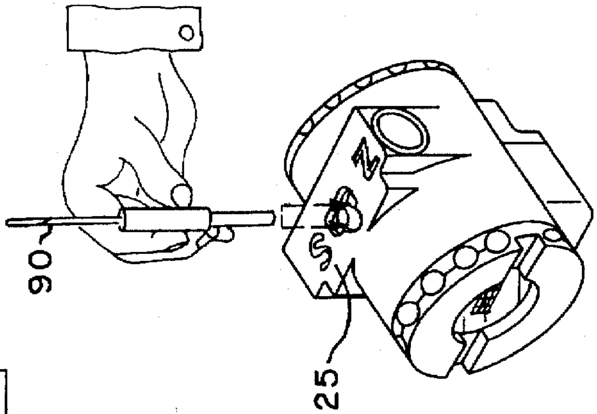
FIG. 4 is a diagram of the converter circuit of the present invention being programmed though an environmental hazard resistant housing which is water resistant and electrically insulted from the converter's circuits.

Referring to FIG. 4, a diagram of the converter circuit of the present invention being programmed though an environmental hazard resistant housing 25 is shown. The local adjust device 26 is located inside the housing 25. In this embodiment, a magnetic tool 90 is inserted into either hole "S" or hole "Z" for accessing the local adjust device 26 and for selecting the proper parameters of operation for the interface circuit 1. In this manner to inputs can be used to configure the converter circuit 1. Referring back to FIG. 2B, the CPU 22 receives the inputs from the local adjust 26 to set a variety of parameters such as setpoint values, identification tags for use with the Fieldbus 8, and the selection of the conversion that is to be performed by CPU 22 of the conversion circuit 1.

The inputs from the local adjust device 26 are used to maneuver through a "program tree" structure of the program stored in memory (e.g., PROM 23) and executed by the CPU 22. Referring to FIG. **5*a*, a portion of this tree structure is shown. Before the local adjust device 26 is operated, the converter circuit is in a normal display mode as indicated by block 100. In the normal display mode, the converter circuit operates to convert the selected analog signal to a digital signal for display and transfer to the Fieldbus 8. By placing the magnetic tool 90 (see FIG. 4) into the "Z" hole ("Zero"), control passes to block 102 (PSWD Input). In the PSWD block 102 a password (e.g., two consecutive "S" ("Span") inputs) can be used to protect against mistaken modification of device parameters. The letters PSWD appear on the display, shown in FIG. 6, to alert the user as to the function block the program tree is currently in. Once the correct password is entered control passes to block 104** (DEVIC).

Figure 5A:
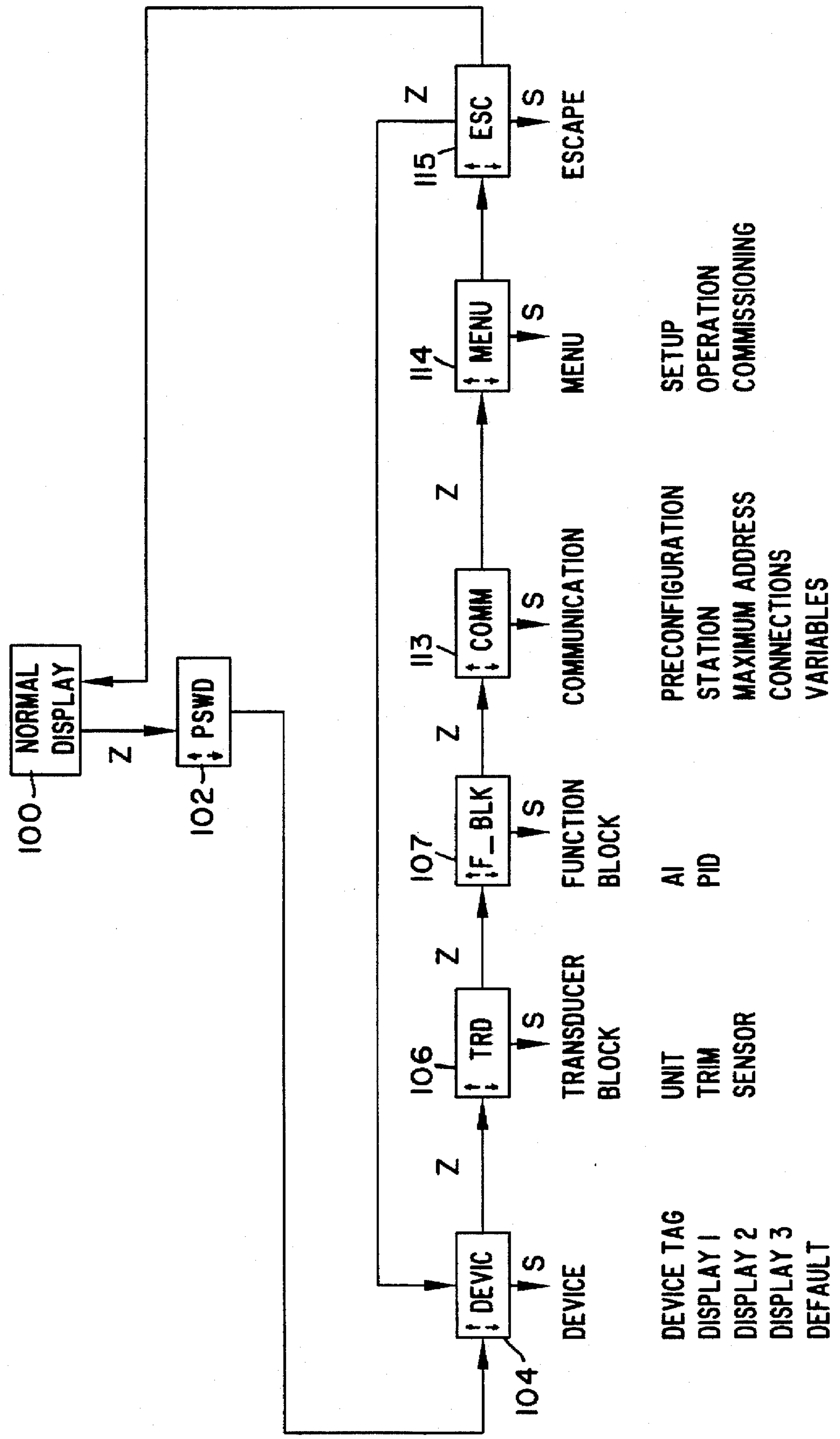
FIGS. 5*a–f* is a flowchart of the operation of a portion of the program in the converter circuit of FIG. 1.

The device block 104, the parameters for a particular device can be modified. The entire program tree for the device block 104 is shown in FIG. **5*b*. By entering an "S" input control passes to block 141 (Tag). In the Tag block 141, the user can view the tag configured for the physical device (i.e., the device being monitored) which is used in the Fieldbus protocol. By entering a "Z" input control passes to blocks 142–144 (LCD_1, LCD_2, LCD_3) which allows the user to display several variables used in converting the analog input signal to an output signal (e.g., the 0–20 mA measured current from the sensor). It is in the DEVIC block 104 that the user can select which output(s) of the sensor transmitters 91, 92, and 93 is to be displayed. In block 145 (DEFLT), the user can select a default configuration for the aforementioned variables. By entering an "S" input while in block 146 (ESC) control passes back to device block 104 (FIG. 5*a***).

By entering a "Z" input from the device block, control passes to block 106 (TRD). The operation of the converter circuit 1 of the present invention can be thought of as a network node comprising a plurality of functional blocks being implemented by the program running in the CPU 22. These functional blocks are "coupled" together in a manner consistent with the processing that occurs to the input analog signals from the sensor transmitters 91, 92, and 93. These functional blocks include three transducer blocks, three analog input blocks, one proportional-integral-derivative (PID) block, and others described more fully below. The transducer blocks take the inputs of the sensor transmitters 91, 92, and 93 and supply them to respective analog input functional blocks. These analog input blocks then supply their outputs to the PID block.

Figure 5B:
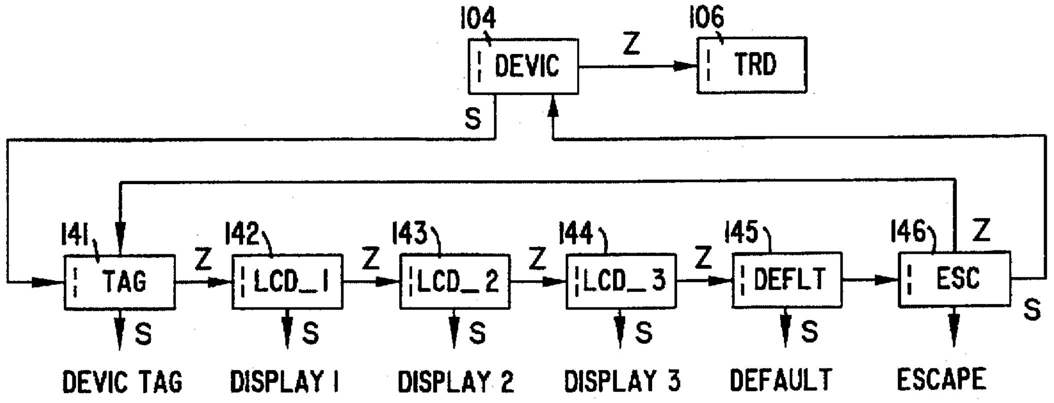
Figure 5C:
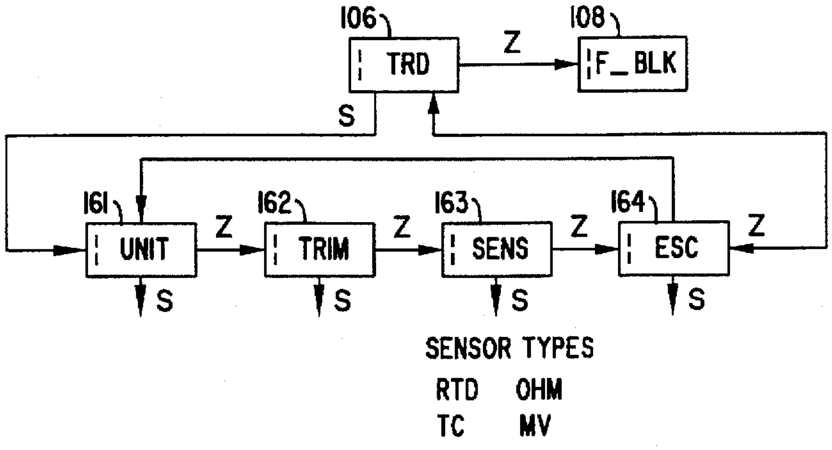
Figure 5D:
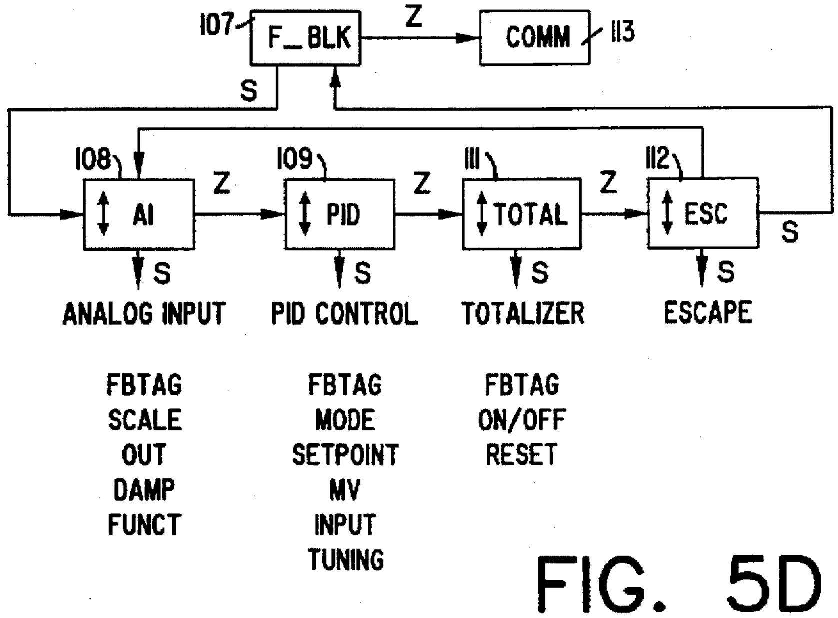
Figure 5E:
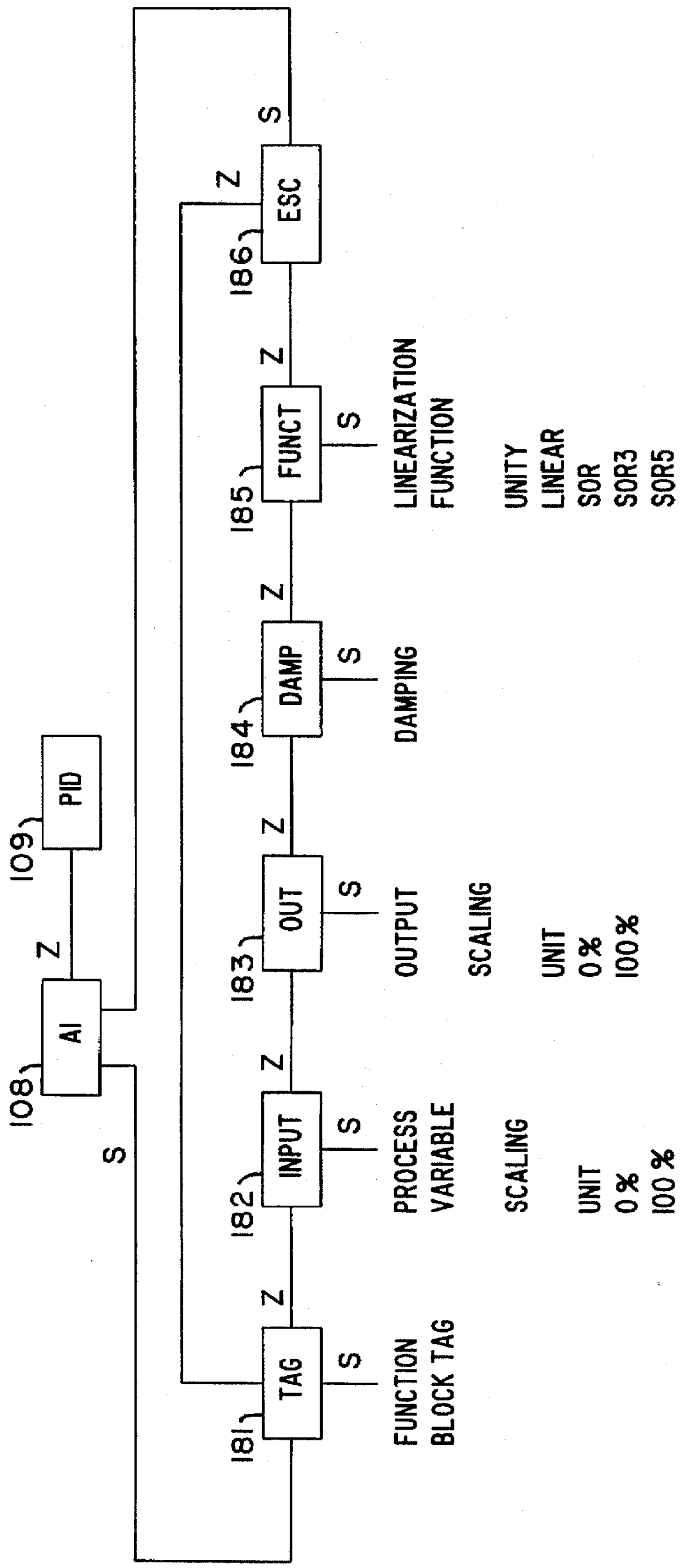

Referring to FIG. **5*c*, the program tree for the TRD block 106 is shown. In block 106, the user must select one of the three transducer blocks used for the input of analog signals from the transmitters 91, 92, and 93 (see FIG. 2). Once the proper transducer is selected, an "S" input transfers control to block 161 (UNIT). In block 161 the unit for the transducer lock is selected. In this embodiment, the unit of the input is in milliamps (mA). In block 162 (TRIM), a lower or upper trim value can be selected. By selecting TRIM, the user can display the current that is currently being measured by the selected transducer and can be compared to an external parameter for calibration. A "Z" input transfers control to block 163 (SENS). In block 163, the sensor type can be selected such as RTD (resistance-temperature detector), TC (thermocouple), Ohmmeter, or millivolt meter. Thus a variety of sensors can be coupled to the converter circuit of the present invention. By entering an "S" input in block 164, control passes back to TRD block 106. By entering a "Z" input in TRD block 106, control passes to block 107 (F_BLK). A more detailed program tree for the Function Block 107 is shown in FIG. 5*d*. By entering an "S" input, control passes to block 108 (AI). A more detailed program tree for the Analog Input block 181 is shown in FIG. 5*e*. In block 108, the user must select one of the three analog input blocks that accepts the 0–20 mA signal from the corresponding transducer blocks referred to in FIG. 5*c*. Once one of the Analog input blocks have been chosen, a "S" input transfers control to block 181 (Tag). Like block 141** in FIG. 5*b*, tag block 181 allows the user to view the analog input block tag which is used in the Fieldbus protocol. A "Z" input passes control to block 182 (Input). In the input block 182, the user is able to set the scaling for the process variable of the analog input in a manner similar to the setting of trim in block 162 of FIG. 5*c*. Alternatively, the user can input a setpoint value independent of applied input to set the scaling for the analog input block. A "Z" input passes control to block 183 (Out).

In the output block 183, the scaling of the analog input block can be adjusted in a manner similar to the input block 182. The output unit can also be set to any of a variety of measurable quantities such as pressure, temperature, and flow values. By entering a "Z" input, control passes to block 184 (Damp). Block 184 allows the user to set a damping value between 0 and 32 seconds in this embodiment. By entering a "Z" input, control passes to block 185 (Funct). The function block 185 allows the user to select the linearization function performed on the input signal (e.g., unitary, linear, square root, square root of the third power, and square root of the fifth power). Entering an "S" input in the escape block 186 returns control to the analog input block 108.

Figure 5F:
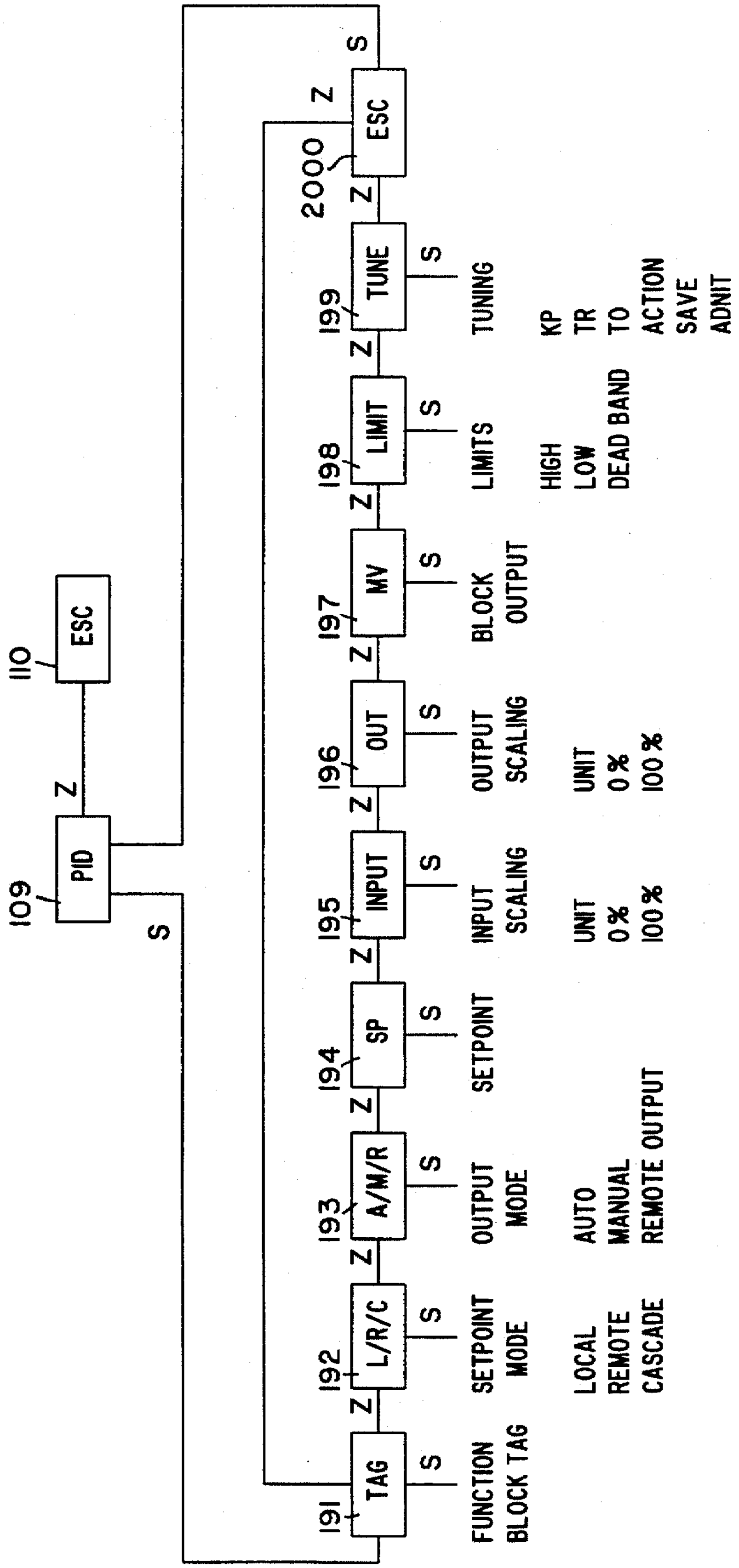

Entering a "Z" input while in block 108 transfers control to block 109 (PID). Referring to FIG. 5*f*, a more detailed program tree for the Proportional-Integral-Derivative block 109 is shown. In block 191 (Tag), the user is able to look at the function block tag for the PID function block. In block 192 (L/R/C), the user can set the setpoint mode for the PID function block. In this embodiment, the options are local, cascade, or remote cascade. In block 193 (A/M/R), the output mode for the PID function block can be set to either an auto mode, a manual mode, or a remote output mode. In block 194 (SP), the setpoint for the PID function block can be set. In blocks 195 and 196 (Input and Output), the input and output scaling can be set for the PID function in a manner similar to that of 182 and 183 in FIG. 5*e*. In block 197 (MV) the manipulated variable of the PID function block can be set. In block 198, output limits for the PID function block can be set. Finally, in block 199, the PID function block can be tuned by setting tuning parameters such as proportional gain (KP), integral time (TR), and derivative time (TD). In block 199, the user can also change the control action between direct and reverse. The user can also monitor the process variable, setpoint and manipulated variable while the tuning is done. If the user desires, the parameters set while in the tuning block 199 can be saved in memory (e.g., the EEPROM of the CPU 22) for later retrieval. By entering an S input while in escape block 2000, control passes back to PID block 109. Referring back to FIG. 5*d*, by entering an "S" input while in escape block 110, control passes to block 111 (Total).

In Total block 11, the user is given the capability of setting parameters for a totalizer function block. Control passes back to block 107 via escape block 112. Referring back to FIG. 5*a*, block 113 (communication). In block 113, the user is capable of a variety of communication functions for the Fieldbus protocol. In block 114 (menu), the user is able to select an operation or commissioning menu which is a subset of the program tree described above. In doing so, those function that are necessary during operation or commissioning are made available to the user to speed access through the programming tree. By entering an "S" input in escape block 115, control passes back to block 100, and the normal display is shown. While in block 100, the converter circuit 1 operates to display the desired variables to the user for the sensors connected to the converter circuit 1.

Figure 7:
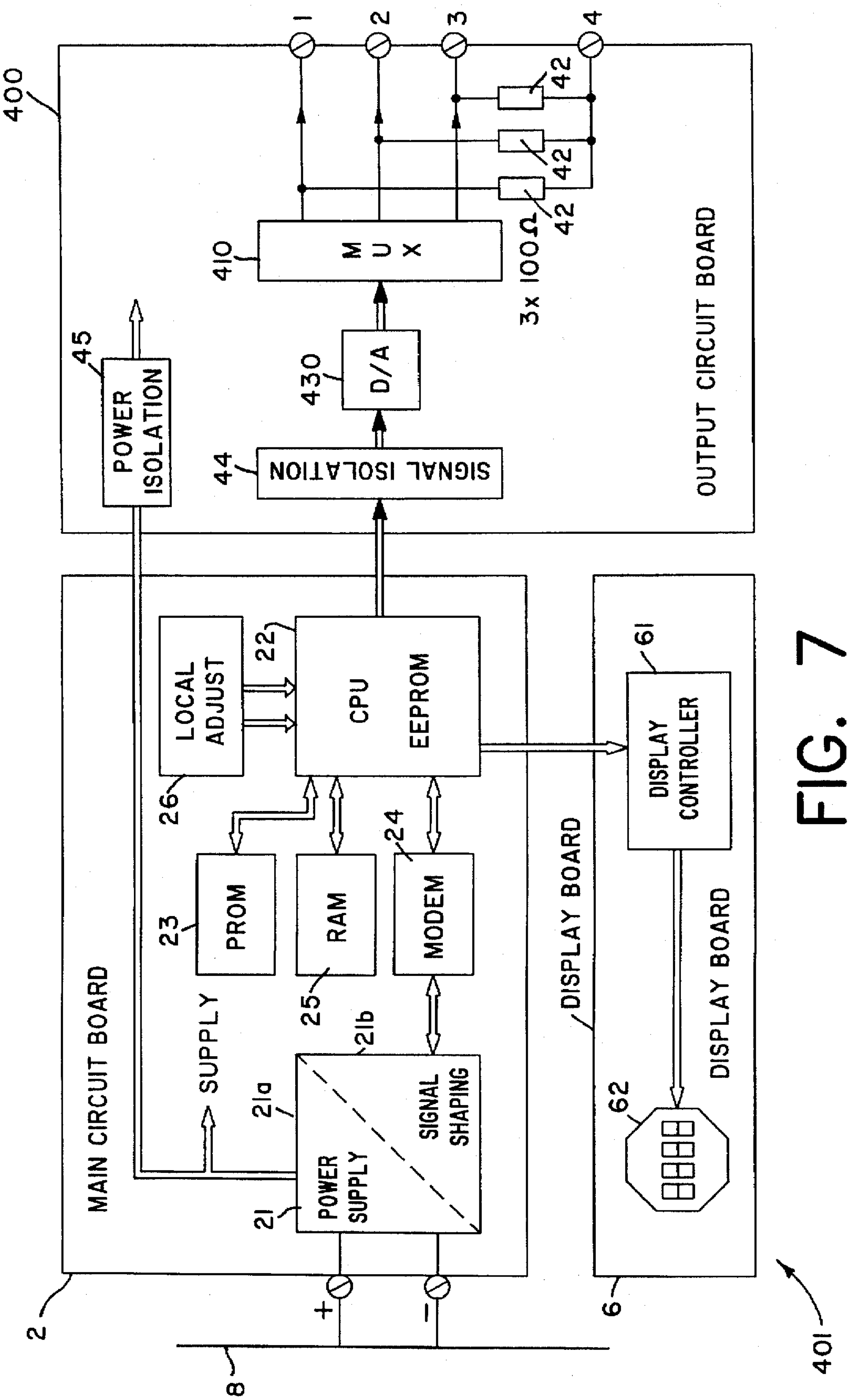
FIG. 7 shows an embodiment of the converter circuit of the present invention for converting digital Fieldbus compliant signals to analog, e.g., 4–20 mA signals.
Figure 8:
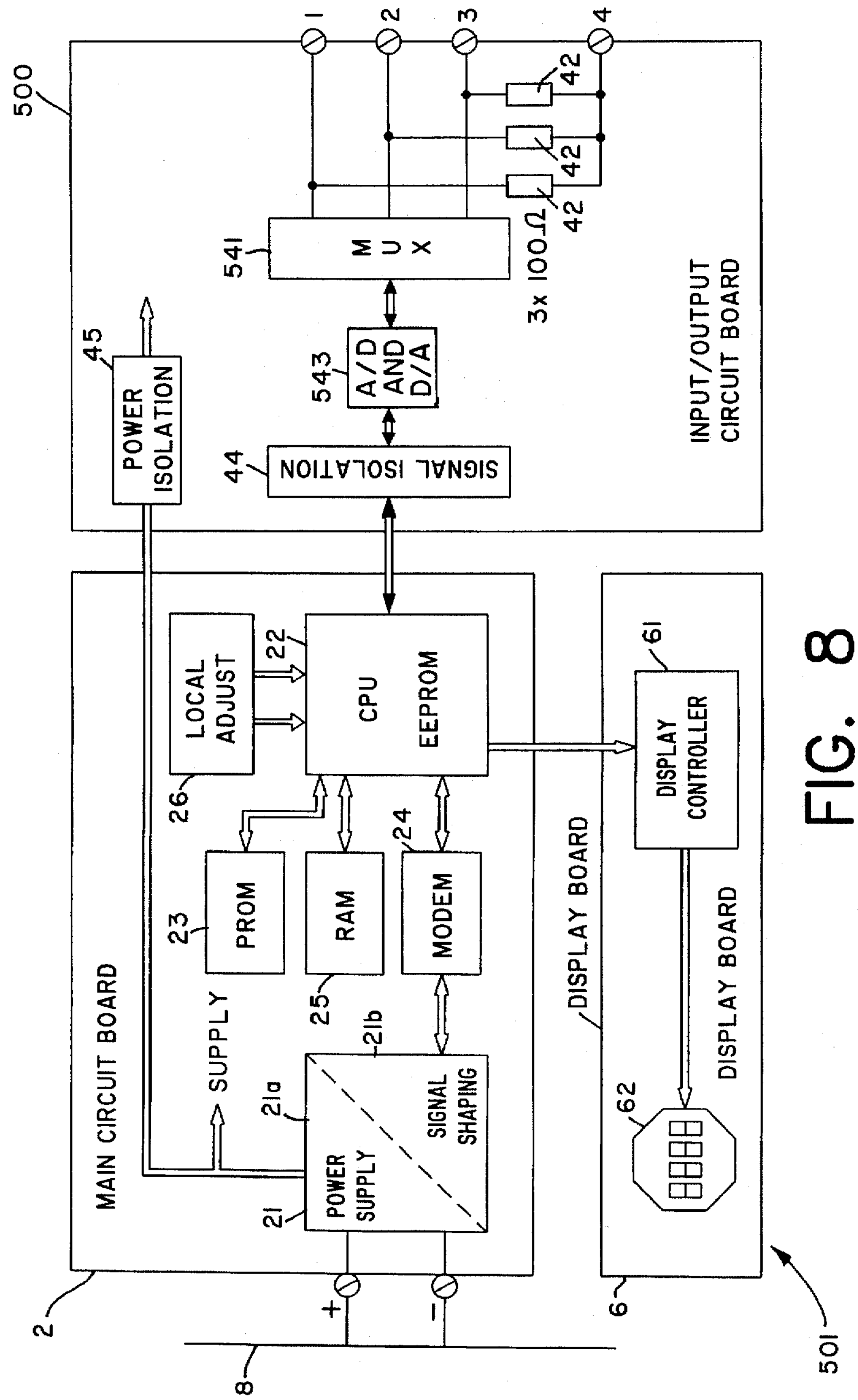
FIG. 8 shows an embodiment of the converter circuit of the present invention for converting between digital Fieldbus compliant signals and analog signals.

While the converter circuit 1 of the present invention has been described above in regard to FIGS. 2B and 2C as a circuit for converting an analog signal to a Fieldbus signal, it can also be implemented, as illustrated in FIG. 7 as a Fieldbus signal to analog signal converter circuit 401 by using, e.g., a digital to analog (D/A) converter 430 circuit instead of the A/D converter circuit 43 or as a bi-directional converter circuit 501 for converting between both A/D and D/A signals by incorporating both an A/D and D/A converter 543 as illustrated in FIG. 8. In the embodiment of FIG. 7, the circuit board 400 serves as an output circuit board while the circuit board 500 of FIG. 8 serves as an input/output circuit board.

What is claimed is:

1. A protocol conversion device for use in a control system including a plurality of field devices, the protocol conversion device comprising:

an input circuit coupled to the plurality of field devices for receiving and providing an analog signal from one of the plurality of analog field devices, the analog signal having a current ranging approximately between 4–20 mA;

a first system converting the analog signal into a digital Fieldbus signal;

a second system converting the digital Fieldbus signal into the analog signal; and a connecting system coupling the first system to a bus and the second system to an analog control device.

2. The protocol conversion device of claim 1, wherein the input circuit includes a multiplexer for receiving a plurality of analog signals and for outputting one of the plurality of analog signals to the first system.

3. A protocol conversion device for use in a control system comprising:

an input circuit for receiving a Fieldbus compliant digital signal;

a first system converting the Fieldbus compliant digital signal into an analog output signal having a current in the range of 4–20 mA; and a connecting system coupling the first system to an analog control device.

4. The protocol conversion device of claim 3, wherein the connecting system includes a multiplexer for coupling the first system to one of a plurality of analog control devices, and wherein the first system includes a central processing unit and a digital to analog converter.

5. A converter circuit capable of converting analog output signals of at least two sensor transmitters into digital signals comprising:

an input circuit coupled to at least two sensor transmitters and including:

I. a multiplexer having at least two inputs and one output, the inputs of the multiplexer receiving analog output signals from each of the sensor transmitters, the multiplexer selecting one of the sensor transmitters such that the analog output signal from the selected sensor transmitter is coupled to the output of the multiplexer, and ii. an analog-to-digital converter coupled to the output of the multiplexer, the analog-to-digital converter converting one of the analog output signals that is present at the output of the multiplexer into a corresponding digital signal; and a main circuit coupled to the input circuit and including:

i. a central processing unit coupled to the analog-to-digital converter and to the multiplexer, the central processing unit controllably selecting the analog output signal from the selected sensor transmitter and converting the digital signal from the analog-to-digital converter to a digital quantity of a property of interest from the selected sensor transmitter, and ii. a local adjust coupled to the central processing unit, the local adjust allowing a user to input conversion parameters for operating the central processing unit and displaying an operation criteria of a display controller into the central processing unit.

6. The converter circuit of claim 5, further comprising:

a display circuit coupled to the main circuit, said display circuit including:

a display device, and a display controller coupled between the central processing unit and the display device, the display controller receiving the digital quantity of a property of interest from the central processing unit and displaying the digital quantity on the display device.

7. The converter circuit of claim 5, wherein each of the analog output signals from each of the sensor transmitters is a 0–20 mA analog signal.

8. The converter circuit of claim 5, wherein each of the analog output signals from each of the sensor transmitters is a 4–20 mA analog signal.

9. The converter circuit of claim 5, further comprising:

a communication bus coupled to the central processing unit, such that the digital quantity of the property of interest is transmitted to the communication bus.

10. The converter circuit of claim 9, wherein the communication bus operates according to a Fieldbus architecture.

11. The converter circuit of claim 9, further comprising:

a modem circuit coupled between the central processing unit and the communication bus and controlling communication of the digital quantity on the communication bus.

12. The converter circuit of claim 11, wherein the communication bus operates according to a Fieldbus architecture.

13. The converter circuit of claim 12, wherein the property of interest is pressure.

14. The converter circuit of claim 12, wherein the property of interest is temperature.

15. The converter circuit of claim 12, wherein the property of interest is flow rate.

16. A converter circuit capable of converting analog signals of at least two sensor transmitters into digital signals and capable of converting the digital signals into the analog signals, the converter circuit comprising:

an input circuit coupled to at least two sensor transmitters and including:

a first system receiving and dispatching the analog signals via each of the sensor transmitter and selecting one of the sensor transmitters such that the analog signal from the selected sensor transmitter is coupled to the output of the first system, a second system converting one of the analog signals appearing at the output of the first system into a digital signal, and a third system converting one of the digital signals into a corresponding analog signal;

a main circuit coupled to the input circuit and including:

a control system selectably controlling the analog signal from the selected sensor transmitter and one of the digital signals, the control system converting the digital signal from the the second system in the input circuit to a digital quantity of a property of interest from the selected sensor transmitter;

a display system displaying the digital quantity; and a fourth system receiving the digital quantity of the property of interest from the first system of the main circuit and formatting the digital quantity for the display system, the fourth system coupled to the third system and receiving the digital signals.

17. The converter circuit of claim 16, wherein each of the analog output signals from each of the sensor transmitters is a 4–20 mA analog signal.

18. The converter circuit of claim 16, further comprising:

a fifth system communicating digital values and coupled to central processing unit, such that the digital quantity of the property of interest is transmitted to the fifth system.

19. The converter circuit of claim 18, wherein the fifth system operates according to a Fieldbus architecture.

20. The converter circuit of claim 18, further comprising:

a sixth system controlling communication of the digital quantity on the communication bus; the sixth system coupled between the first system in the main circuit and the fifth system.

21. The converter circuit of claim 20, wherein the fifth system operates according to a Fieldbus architecture.

22. The converter circuit of claim 16, wherein the main circuit further includes:

a seventh system inputting user conversion parameters for the first system in the main circuit, the seventh system providing a display criteria to be displayed on the display system into the first system in the main circuit.

* * * * *